(12) United States Patent
Shia et al.

(10) Patent No.: US 6,542,367 B2
(45) Date of Patent: Apr. 1, 2003

(54) SECURING HEAT SINKS

(75) Inventors: David Shia, Bellevue, WA (US); Thomas J. Wong, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/871,587

(22) Filed: May 31, 2001

(65) Prior Publication Data
US 2002/0181204 A1 Dec. 5, 2002

(51) Int. Cl.[7] .................................................. H05K 7/20
(52) U.S. Cl. ........................ 361/703; 24/458; 248/510; 257/719; 361/719
(58) Field of Search ........................ 24/294–297, 453, 24/457, 458, 625; 248/505, 510; 361/703, 704, 687, 697, 709–712, 717–719; 257/718, 719, 726, 727; 174/16.3; 165/121–126, 80.3, 185; 439/485, 487; 29/557, 890.03

(56) References Cited

U.S. PATENT DOCUMENTS

| | | | | |
|---|---|---|---|---|
| 4,506,419 A | * | 3/1985 | Mitomi ........................ 24/297 |
| 5,542,468 A | | 8/1996 | Lin ........................... 165/80.3 |
| 5,933,325 A | | 8/1999 | Hou ........................... 361/704 |
| 5,933,326 A | | 8/1999 | Lee et al. .................... 361/704 |
| 5,953,212 A | | 9/1999 | Lee ............................ 361/709 |
| 5,990,552 A | | 11/1999 | Xie et al. .................... 257/718 |
| 6,058,579 A | * | 5/2000 | Brocklesby et al. ........... 24/459 |
| 6,061,239 A | | 5/2000 | Blomquist .................... 361/704 |
| 6,082,440 A | * | 7/2000 | Clemens et al. ............. 165/80.3 |
| 6,101,091 A | | 8/2000 | Baik .......................... 361/704 |
| 6,108,207 A | | 8/2000 | Lee ............................ 361/704 |
| 6,118,661 A | | 9/2000 | Lo ............................. 361/704 |
| 6,181,559 B1 | | 1/2001 | Seo ............................ 361/704 |

* cited by examiner

Primary Examiner—Gerald Tolin
(74) Attorney, Agent, or Firm—Fish & Richardson P.C.

(57) ABSTRACT

A heat sink retention frame is disposed about an electronic package, and a heat sink is disposed within the heat sink retention frame above the electronic package. A clip is mounted across a lateral edge surface of the heat sink and fastened to the heat sink retention frame. The clip can help hold the heat sink in place during normal operation and can retain the heat sink in the retention frame during mechanical shocks.

9 Claims, 5 Drawing Sheets

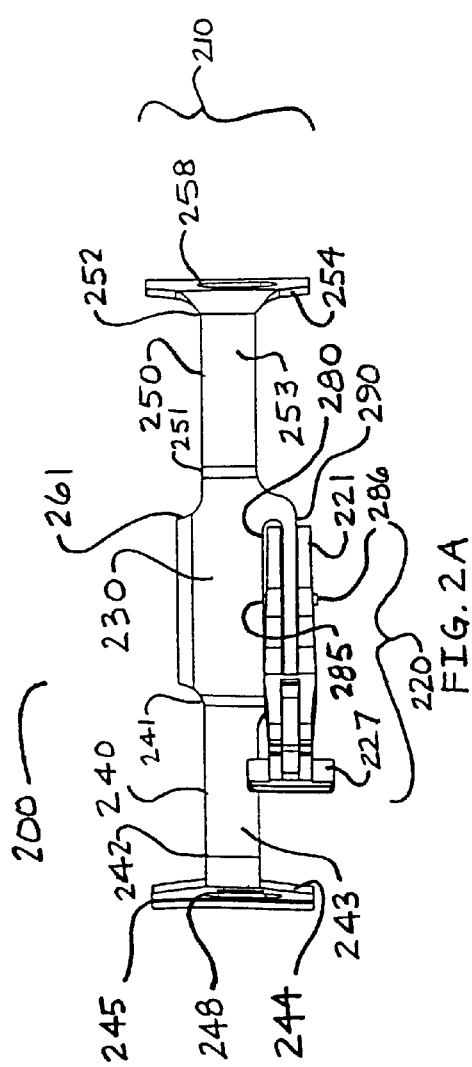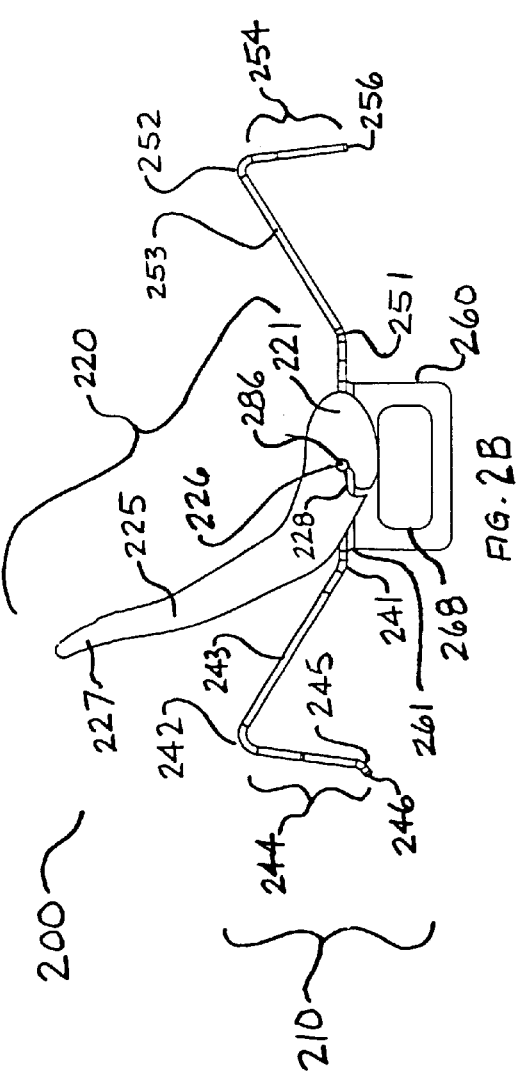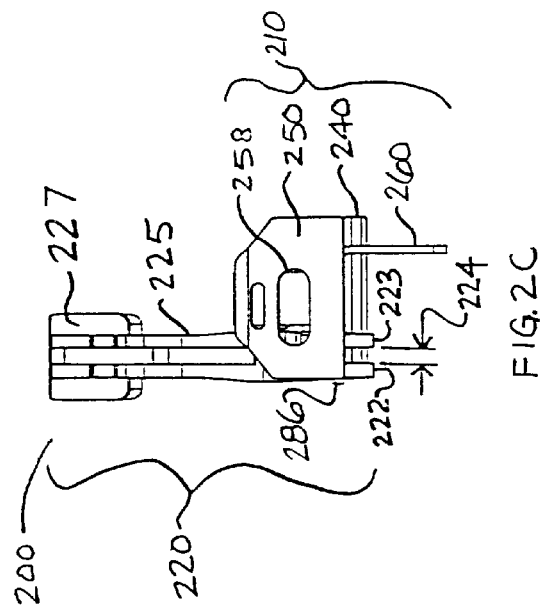

SECURING HEAT SINKS

BACKGROUND

The invention relates to securing heat sinks.

Clips are sometimes used to maintain heat sinks in heat-transferring contact with electronic packages or semiconductor devices. Downward force exerted on the heat sink by the clip contributes to efficient heat transfer from the device to the heat sink.

The size and weight of heat sinks for removing heat from electronic packages or semiconductor devices has increased as the amount of heat produced by newer versions of these devices has increased. For example, heat sinks having a weight of one pound or heavier are known and are presently in use in industry. Simple clips, which have traditionally been used for lighter, less bulky heat sinks, have proven inadequate for securing the more substantial heat sinks, especially when the assembly is subjected to mechanical shock.

BRIEF DESCRIPTION OF DRAWINGS

FIGS. 2A, 2B, and 2C illustrate several views of the clip.

DETAILED DESCRIPTION

Figure 1:
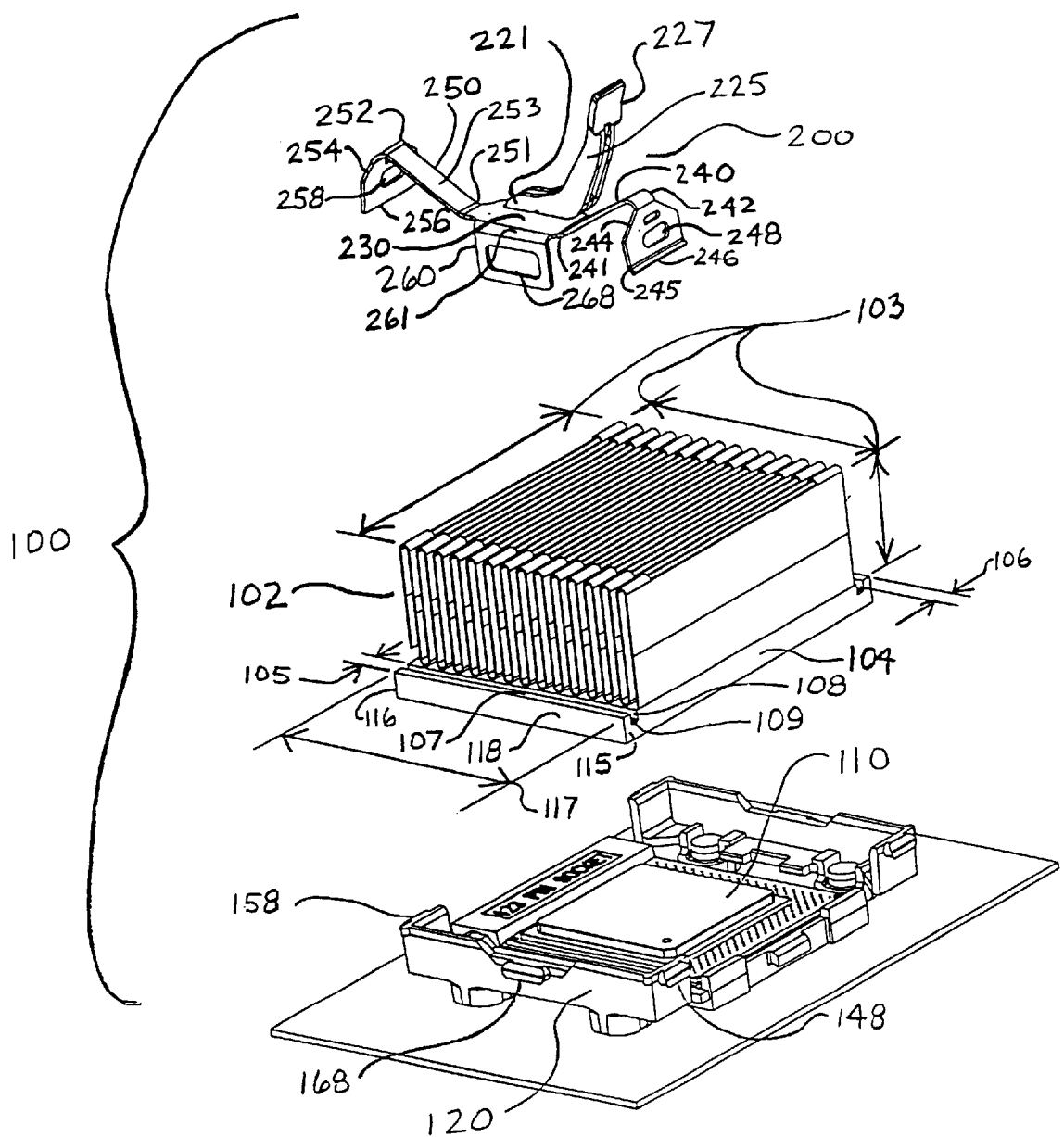
FIG. 1 is a vertically-exploded view of an assembly containing an example of a clip.

As shown in FIG. 1, a vertically-exploded view 100 of an assembly (e.g., the unlocked assembled arrangement 400 of FIG. 4) contains a clip 200, a high-mass heat sink 102, an electronic package or semiconductor device 110, and a heat sink retention frame 120.

Heat sink 102 has a heat-exchanging region 103, and a base 104. Edge regions 105, 106 of the base 104 extend beyond the downwardly-projected footprint of the heat-exchanging region 103. Edge region 105 has, along its entire length, a flat upward-facing surface 107 and a straight rectangular channel 108 that includes a flat upward-facing surface 109 at the bottom of the channel. Edge region 106 has similar features.

As shown in FIGS. 2A, 2B and 2C, the clip 200 includes a main body 210 that can be fabricated, for example, from heat-treated carbon steel 1050 which can be punched or cut to the desired form. The clip also includes a camming member 220 with a cam 221. The clip 200 can be lowered into contact with edge region 105 of heat sink 102 (FIG. 1) by inserting the cam surface 222 of camming member 220 into channel 108 and permitting upward-facing surface 107 to extend into a gap 224 between cam surface 222 and 223 (FIG. 2C).

Clip arms 240, 250 bend upward near support 230 at first bends 241, 251 respectively, and bend downward at second bends 242, 252 near their respective ends 246, 256. End portions 244, 254 of clip arms 240, 250 extend in a substantially downward direction. Clip arms 240, 250 extend in opposite lateral directions from support 230. Clip arms 240, 250 are sufficiently long that clip arm end portions 244, 254 can be positioned beyond the respective ends 115, 116 of edge region 105. After they are so positioned, end portions 244, 254 of the clip arms are urged downward, and loops 248, 258 (which may be referred to as mating elements) are attached to respective hooks 148, 158 (which may also be referred to as mating elements) on the heat sink retention frame 120 (see FIG. 4).

The downward urging of clip arms 240, 250 generates a spring force in the clip arms in opposition to the downward force, especially in the vicinity of bends 241, 251 and in straight portions 243, 253 of the clip arms. The bends 241, 251 behave like leaf springs, and the straight portions 243, 253 behave like beam springs. The spring forces cause the clip arms 240, 250 to tend to pull up on respective hooks 148, 158. However, because the hooks are fixed extensions of the heat sink retention frame 120, forces of equal magnitude are created that oppose the spring forces and that place the arrangement (the clip and the heat sink retention frame) in static tension (see FIG. 4).

The combination of the foregoing interactions between clip arms 240, 250 and the heat sink retention frame 120 imparts a downward force to the clip 200. The downward force is opposed within the overall assembly in the following manner. Cam surface 222 (see FIG. 2C) pushes down on the upward facing surface 109 of edge region 105. The heat sink 102 pushes up against the clip 200 with a force of equal magnitude, thus placing the arrangement (the clip and the heat sink) in static compression (see FIG. 4).

The interaction between the clip 200 and the heat sink 102 tends to maintain the heat sink seated within the heat sink retention frame 120 and to maintain the heat sink above and adjacent to the semiconductor device 110 during normal operation of the semiconductor device, as well as when the overall assembly is subjected to forces such as low magnitude shock forces. Such shock forces may occur when the assembly is moved about within the controlled environment of a manufacturing plant or within the premises of the end-user.

In this example, clip arm 260 has a thickness similar to clip arms 240, 250, but is wider. Clip arm 260 extends outward from the side of support 230 in a direction substantially perpendicular to the longitudinal direction in which the first and second clip arms are aligned (see FIG. 2A). The clip arm 260 bends downward at bend 261. During installation of clip 200, loop 268 (which may be referred to as a mating element) is placed over and around hook 168 (which may also be referred to as a mating element) of the heat sink retention frame 120 (see FIG. 4). During normal operation, no substantial interaction, pulling or otherwise, is expected to occur between clip arm 260 and hook 168. As discussed in greater detail below, the interaction between clip arm 260 and loop 268 may become important during shock events involving forces of relatively high magnitude vertically-oriented shock events (e.g., "+z" shock events) that tend to urge the heat sink upward and out of the heat sink retention frame.

A second clip (not shown) can be provided and mounted to edge region 106 in a similar fashion.

Spring force can be generated within the clip 200 when it is subjected to forces that tend to straighten the clip at bends 241, 242, 251 or 252 or to bend the clip at straight sections (e.g., support 230 and straight portions 243, 253) as long as the magnitude of the strain experienced by the clip remains within the elastic range of the clip material.

The outward bend 245 at the end 246 of clip arm 240 allows the clip to be connected to the heat sink retention frame 120 from above. The loops 258, 268 of the second and third cantilevered clip arms 250, 260 are placed over their corresponding hooks 158, 168 (see FIG. 1), and the third cantilevered clip arm 240 is slid over its corresponding hook 148 until loop 248 snaps inward around the hook. Once installed on the frame 120, the clip 200 can easily be pried off by pulling out and up at bend 245 of end 246.

Spring force can be generated within third clip arm 260 in a manner similar to that described above with respect to the first and second clip arms 240 and 250. The spring formed between the support 230 and the third clip arm 260 in the vicinity of bend 261 can involve wider members than the springs associated with the first and second clip arms, because the third clip arm is designed to extend over and around the side 118 of heat sink 102 (which represents the widest aspect of edge region 105), whereas the first and second clip arms 240, 250 extend over and around the two narrower ends 115, 116 of edge region 105. As a result, the spring constant of the spring associated with bend 261 can exceed those of the springs associated with the first and second clip arms 240, 250.

As shown in FIGS. 2A, 2B and 2C, the cam 221 is split between two parallel portions which are separated by a gap 224 and which present camming surfaces 222, 223. The cam lever 225 also has two parallel portions which are partially separated by a gap. For purposes of structural integrity, the portions of the cam lever 225 are connected at certain points along their length by material that spans the gap, including a tab 227 at the end of the camming member 220 opposite the camming surfaces 222, 223. Camming member 220 can be produced, for example, by a molding process, and can comprise glass-filled polycarbonate plastic. As discussed in greater detail below, the camming member 220 can be positioned selectively in a locked position or an unlocked position.

A gap 280 is located near the far edge 290 of support 230, opposite bend 261 of the third clip arm 260. A pivot post 285 for the cam 221 spans the gap. A second cam pivot post 286 projects from the far edge 290 of support 230 and is axially aligned with the first pivot post 285. If a progressive die is used to produce a sheet metal blank for the clip, additional machining may be needed to finish the pivot posts. The pivot posts can have a circular cross section to mate with a circular pivot hole 226 on the cam. Alternatively, a single cam pivot post can be provided which extends across and past the gap to provide the functions of the two cam pivot posts 285, 286.

The camming member 220 is mounted to the main body 210 of the clip 200 on pivot posts 285, 286. The camming member 220 engages the two opposing cam pivot posts 285, 286 within a mating pivot hole 226 that forms the pivot point of the cam 221. A wave-shaped slot 228 facilitates installation and retention of the camming member 220.

The wave-shaped slot 228 can enhance performance of the camming member 220 when the latter is in its unlocked position. In the event the pivot hole 226 of the camming member 220 becomes dislodged from the pivot posts 285, 286 (e.g., during initial assembly prior to locking or as a result of movement of the unlocked assembly within the assembly plant), the camming member 220 is unlikely thereafter to be jogged sufficiently to dislodge entirely from the main body 210 of the clip because of the circuitous contour of the wave-shaped slot 228. Thus, when the cam 221 is to be rotated to the locked position, which may occur some time after initial assembly, there will be little chance that the camming member 220 will become detached from the main body 210 of the clip. The wave-shaped slot 228 remains available to trap the camming member 220 if, subsequent to rotation and locking, it becomes unlocked and pivot hole 226 becomes dislodged from the pivot posts.

Figure 3A:
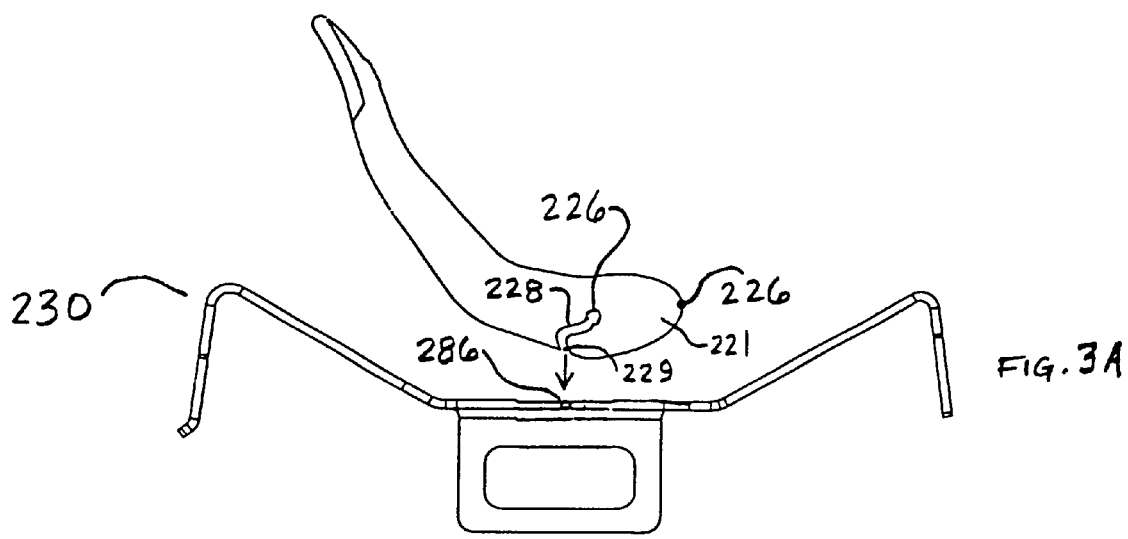
FIGS. 3A and 3B are side views depicting assembly of the clip.
Figure 3B:
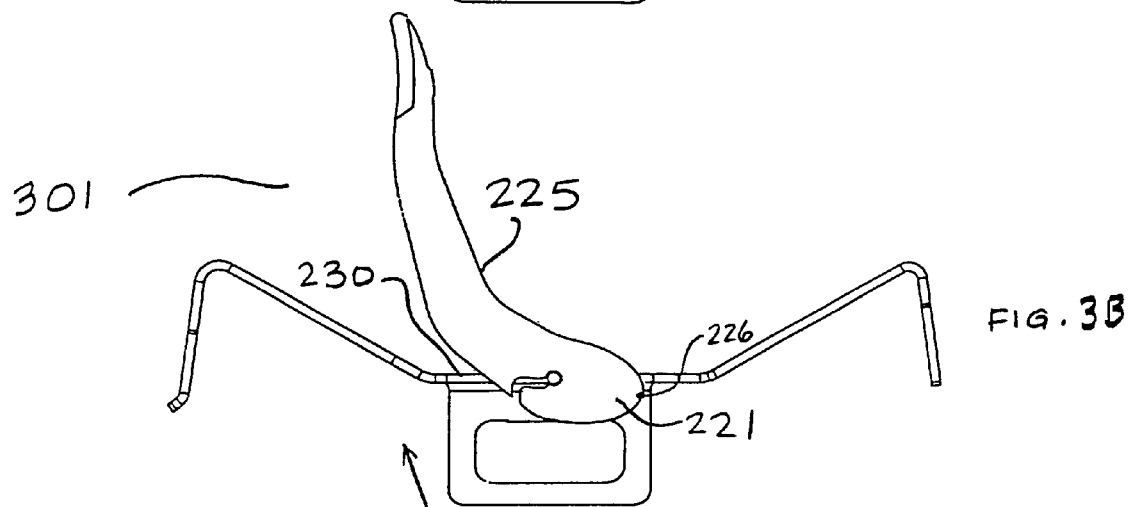

As shown in FIG. 3A, to attach the camming member 220 to the main body 210 of the clip, the camming member is positioned so that the aperture 229 of the wave-shaped slot 228 faces downward, above the pivot posts 285, 286. The camming member 220 is then lowered so that the posts enter the slot. The cam lever 225 is then jogged so that the pivot posts move through the slot, coming to rest within the pivot hole 226, as shown in FIG. 3B.

The cam 221 projects a short distance below support 230 when the camming member 220 is in the unlocked position 301 shown in FIG. 3B. When assembled with the heat sink 102 (FIG. 4), a portion of cam 221 corresponding to cam surface 222 (FIG. 2C) enters into the channel 108 (FIG. 1), whereas a portion of cam 221 corresponding to cam surface 223 moves adjacent to side 118 of the heat sink. Alternatively, the clip may be used with a heat sink having no channel or having multiple channels.

Figure 3C:
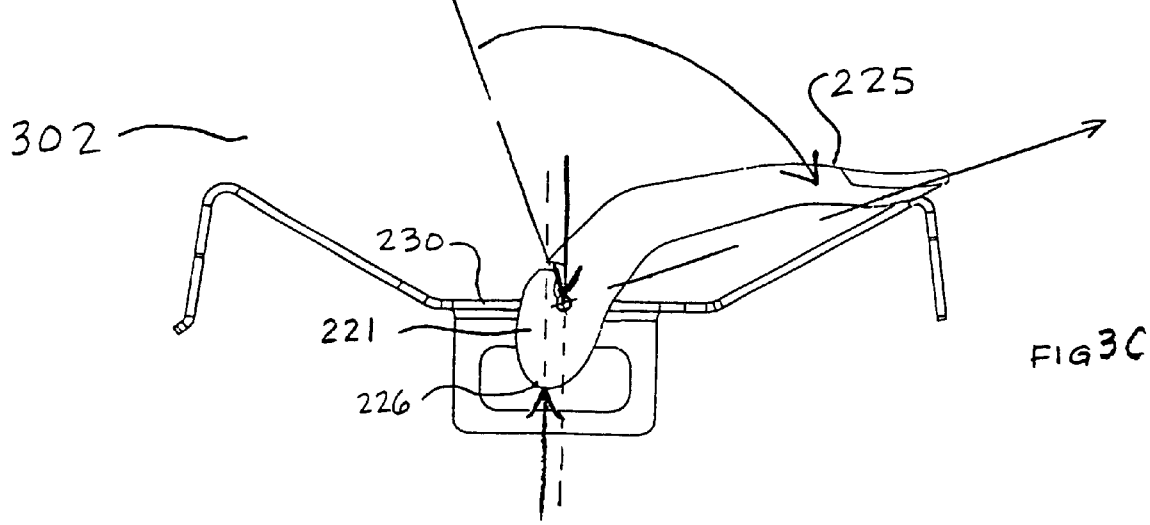
FIG. 3C is a side view depicting operation of the clip.

As shown in FIG. 3C, cam 221 can project progressively further below support 230 when camming member 220 is rotated (as indicated by the curved arrow). When clip 200 is assembled with the heat sink 102, and as rotation of camming member 220 progresses from the unlocked position 301 (FIG. 3B) to the locked position 302 (FIG. 3C), cam surface 222 (FIG. 2C) of the cam 221 presses with increasing downward force within channel 108 (FIG. 1) against the upward-facing bottom surface 109. Cam apex 226 (the location of maximum cam radius) contacts surface 109 of the heat sink 102 just prior to the camming member 220 reaching the locked position 302. That arrangement (interaction between cam apex 226 and surface 109) corresponds to the maximum downward force which the cam 221 can exert on the heat sink.

When the clip 200 is assembled with the heat sink 102 and heat sink retention frame 120, off-center cam loading enables the cam to self-lock near the maximum force rotation position referenced above. Off-center cam loading is achieved by over-rotation of the cam, in other words, rotation of the cam through a small arc (e.g., about ten degrees) past the position of apex interaction. When the cam is rotated beyond the apex 226, offset forces in the assembly begin to produce a moment (see pair of opposing but offset straight arrows in FIG. 3C), and the moment tends to urge the cam lever away from the unlocked position 301 and toward the locked position 302. In this example, the contour of the slot 280 in the main body 230 of the clip prevents continued rotation of the camming member 220 when it reaches the locked position 302. Other means for preventing further rotation of the camming member 220, such as the interposition of a stop element, also can be used.

Figure 4:
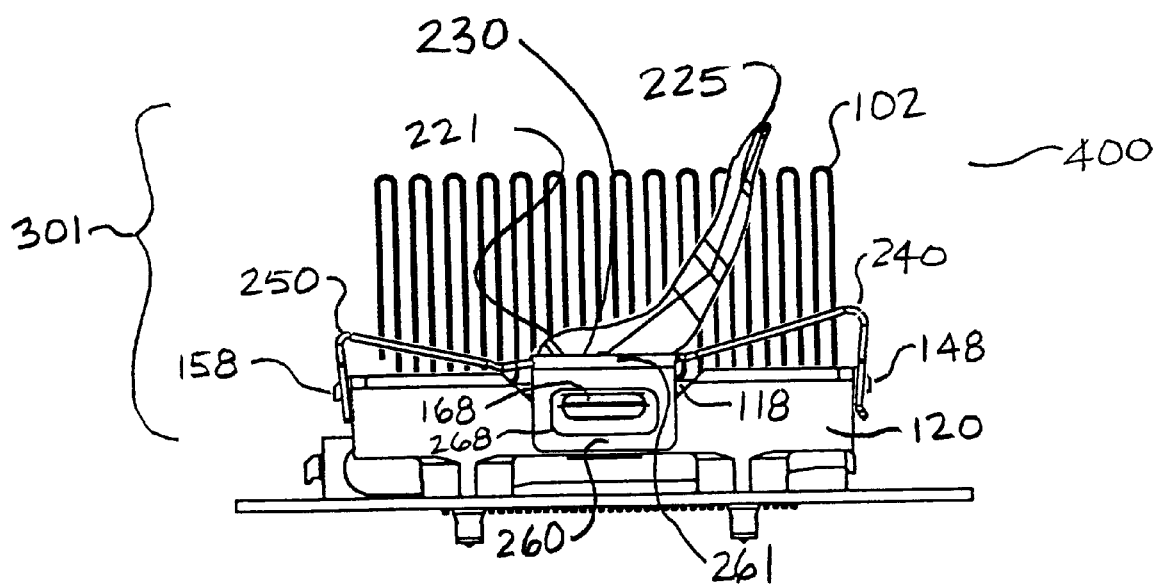
FIG. 4 is a side view of an assembly containing the clip in its unlocked position.

As shown in FIG. 4, to achieve the unlocked assembled arrangement 400, the heat sink 102 is placed in the heat sink retention frame 120, and the clip is positioned over the lateral edge of the heat sink with the camming member 220 in its unlocked position 301 (i.e., cam lever 225 in the upright position). The loops 248, 258 (not shown in FIG. 4) of the first and second clip arms 240, 250 are placed in tensioned engagement with corresponding hooks 148, 158 on the heat sink retention frame. The third clip arm 260 is placed loosely over its corresponding hook 168 so that a tensioned relationship with the hook arises if the loop 268 of the third clip arm translates upward. Other mating arrangements also can be used. For example, the clip arms can have hooks and the heat sink retention frame can have loops.

The first and second clip arms 240, 250 should be engaged with the frame during initial assembly (i.e., prior to locking rotation of the camming member 220) so that the spring force potentials of both clip arms may be utilized in both the unlocked and locked arrangements.

Figure 5:
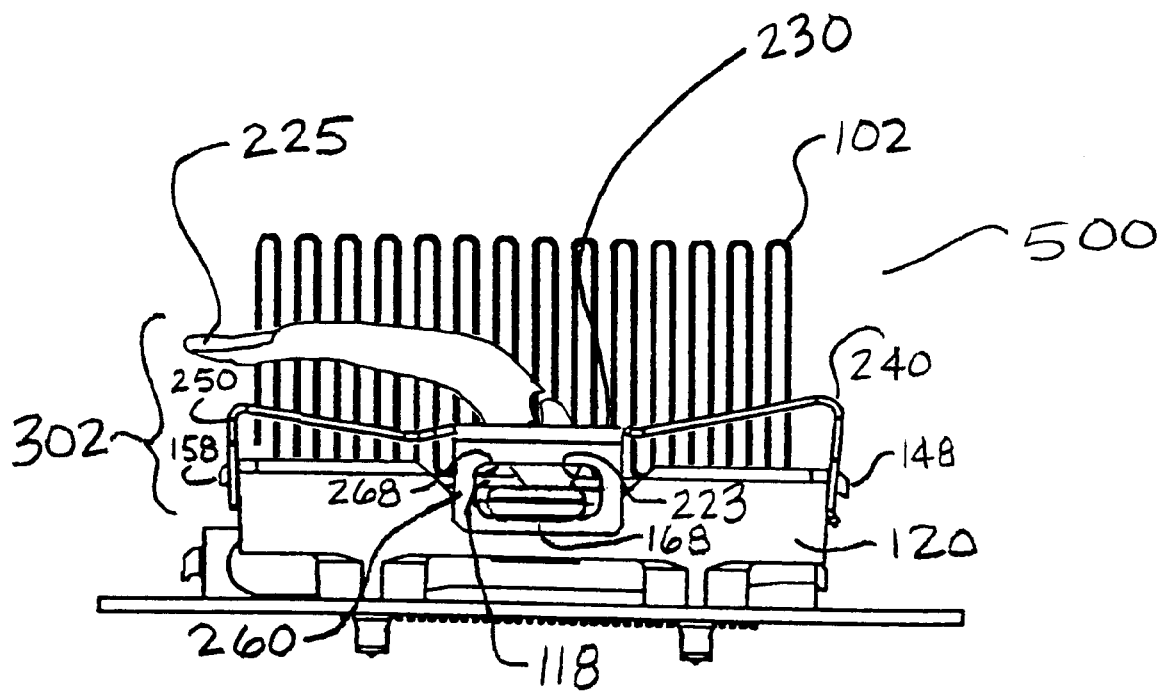
FIG. 5 is a side view of an assembly containing the clip in its locked position.

As shown in FIG. 5, to achieve the locked assembled arrangement 500, the cam lever 225 is rotated downward about ninety degrees until the camming member 220 rests in its locked position 302. An engaged, tensioned relationship remains between the loops 248, 258 (not shown in FIG. 5) in the first and second clip arms 240, 250 and respective hooks 148, 158 on the heat sink retention frame 120, but the first and second clip arms 240, 250, the support 230, and the heat sink retention frame 120 are subject to more force, and therefore more strain, by operation of the camming member 220.

During rotation of the cam lever 225 to place the camming member 220 in its locked position 302 (FIG. 3C), the cam 221 presses against the surface 109 (FIG. 1) of the heat sink 102. Because the cam radius increases with increasing rotation, the middle portion of the support 230 near the pivot posts 285, 286 can deflect gradually upward. The upward force from the cam is resisted by the force of a beam spring (i.e., support 230) fixed at both ends. As the spring formed by support 230 is urged toward increasing deflection, it exerts increasing downward force against the rotating cam through the pivot post(s). The force is transmitted directly to surface 109 of the heat sink 102.

When the camming member 220 is rotated into its locked position 302, the loop 268 of the third clip arm is pulled upward into an undercut area of its corresponding hook 168, causing the loop 268 to be locked in position adjacent to corresponding hook 168. The upward-facing lower surface of the loop and the downward-facing lower surface of the undercut are still not yet engaged, so little or no tension is present. In the event the locked assembly 500 is subjected to excessive mechanical shock sufficient to overcome the downward force exerted by the first and second clip arms and the cam lever, the heat sink 102 will tend to rise within the frame 120, driven by its own momentum. That causes the end of the third clip arm 260 to ride further up within the undercut area of its hook 168, the upward-facing lower surface of the loop and the downward facing lower surface of the hook to meet, and the third clip arm to assume a tensioned relationship with the hook similar to that described above with respect to the first and second clip arms 240, 250. In that way, in the brief instant after heat sink momentum has overcome the pre-load of the clip arms and the cam lever, the undercut hook 168 can prevent further vertical translation of the third clip arm, and thus oppose further upward movement of the heat sink.

The geometry of the undercut of the hook 168 can be matched to within a close tolerance of the thickness of the third clip arm 260. When clip arm 260 translates vertically and engages hook 168, the end of the clip arm will be fixed and prevented from rotating by the tight fit between the parts. That provides a cantilever beam spring, fixed at the free end of third clip arm 260. The beam is formed by the combination of the support 230 and third clip arm 260. This beam, fixed at one end, tends to resist deflection. If the heat sink is subjected to +z shock, the resistance to deflection opposes and can significantly reduce the upward movement of the heat sink.

The clip 200 may be described as bimodal because the clip arms contribute to retention of the heat sink in the retention frame in at least two ways. The first and second clip arms 240, 250 can help retain the heat sink in the retention frame during normal operation of the assembly, and the third clip arm 260 can contribute to heat sink retention during excessive mechanical shock events, such as +z shocks of high magnitude.

The third clip arm 260 operates to restrict upward motion of the heat sink in a way that the first and second arms 240, 250 may not be capable of handling. Specifically, the third arm can be wider and than the other two arms because of the position of the third clip arm 260 on the wide side of the clip's support 230. Also, the third arm can be shorter than the other two arms, because when the clip 200 is assembled with the heat sink and heat sink retention frame, the wide side of the support 230 is positioned adjacent to, and parallel to, the side 118 of base 104 of the heat sink, and the distance from support 230 to the heat sink retention frame 120 along that side is short.

The structure of the third clip arm, when compared to the longer and narrower structure of the first and second clip arms, is stiffer, providing more substantial resistance to continuing upward movement of the heat sink when the assembly is subjected to +z shocks of large magnitude. Thus, the extent of elastic deformation to which the third clip arm structure may be subjected during +z shock can be limited to a narrow range. That can prevent excessive distortion of the clip 200 during shock and can enable the clip to retain the heat sink and keep it well-aligned within the heat sink retention frame 120 during the shock event.

The thickness of the third clip arm 260 can be about the same as that of the first and second clip arms. That allows the entire main body 210 of the clip 220, including all three clip arms and the support 230, to be formed from a single span of sheet stainless steel.

Because clip 200 is equipped with camming member 220, it can provide a greater pre-load (retention force) than similar clips without such a feature. Greater pre-load can lead to increased thermal performance of the heat sink. Moreover, a greater pre-load translates to less heat sink movement during shock. That can reduce or eliminate the likelihood that the electronic package or semiconductor device will pull out from the socket in which it is installed.

The combination of the camming feature with the third clip arm feature in clip 200 provides multiple techniques for keeping the heat sink in place during and after excessive shock. In some implementations, clip 200 can perform this function more effectively than can a similar clip possessing either feature alone. That may be especially true in the case of one-pound or heavier heat sinks subjected to excessive +z direction shocks.

Other implementations are within the scope of the following claims. For example, the thickness of the third clip arm 260 and the central span 230, or the thickness of the third clip arm only, can be increased relative to the thickness of the first and second arm to increase rotation resistance. Also, a single post span, instead of two post spans, may be provided to serve as the attachment and pivot point for the cam. The cam lever, shown as an elongated arm 225 comprising of two parallel portions united at the end of the arm by a tab 227 to facilitate manipulation, can have alternative shapes (e.g., straight, with no tab, and with a round cross-section). However, it should be slender enough to avoid interference with the heat sink and neighboring components and stiff enough to turn the camming member through its range of motion and force exertion. Also, the cam lever may have a different configuration, e.g., the geometry of the cam itself may include a feature which prevents over-rotation, and the cam lever may be designed to be removeable after the cam self-locks. Furthermore, the cam, rather than having two parallel portions, can be unitary, and can be mounted on a single post on the support.

What is claimed is:

1. A clip comprising:

a support;

first and second arms extending in opposite lateral directions from respective opposite first and second lateral sides of the support;

a third arm extending from a third lateral side of the support;

a camming mechanism attached to the support near a fourth lateral side of the support and opposite the third lateral side, the camming mechanism including a cam surface projecting downward below the support; and first, second, and third mating elements located on respective substantially downward-extending free end portions of the first, second and third arms;

wherein each of the mating elements of the free end portions of the first, second and third arms includes a closed loop.

2. A clip comprising:

a support;

first and second arms extending in opposite lateral directions from respective opposite first and second lateral sides of the support;

a third arm extending from a third lateral side of the support;

a camming mechanism attached to the support near a fourth lateral side of the support and opposite the third lateral side, the camming mechanism including a cam surface projecting downward below the support; and first, second, and third mating elements located on respective substantially downward-extending free end portions of the first, second and third arms;

wherein the first and second arms include an intermediate portion between respective attachments with the support and respective free end portions, and wherein the respective intermediate portions at least partially extend above the support.

3. The clip of claim 1, said camming mechanism comprising a cam pivot post mounted to the support and a camming member mounted to the cam pivot post, the camming member including a cam which projects below the support.

4. The clip of claim 3, said camming member further comprising a lever extending radially from the cam for rotating the cam about the cam pivot post.

5. The clip of claim 3, said cam surface having a cam apex corresponding to maximum cam radius, and said camming mechanism further comprising a camming member locking arrangement for securing the cam near a point in its rotation in which the cam apex faces directly downward by employing off-center cam loading.

6. The clip of claim 3 wherein the camming member includes a circuitous installation slot to allow the camming member to be mounted on the cam pivot post and to inhibit unintended complete dislodgement of the camming member from the support if the camming member becomes dislodged from the cam pivot post.

7. The clip of claim 1 wherein the third arm is wider than the first and second arms.

8. The clip of claim 1 wherein the third arm is shorter than the first and second arms.

9. The clip of claim 1 wherein the third arm is thicker than the first and second arms.

* * * * *